(12) United States Patent
Yanagishima et al.

(10) Patent No.: US 12,255,642 B2
(45) Date of Patent: Mar. 18, 2025

(54) SIGNAL TRANSMISSION DEVICE, ELECTRONIC APPLIANCE, AND VEHICLE

(71) Applicant: ROHM CO., LTD., Kyoto (JP)

(72) Inventors: Daiki Yanagishima, Kyoto (JP); Akio Sasabe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 4 days.

(21) Appl. No.: 18/006,105

(22) PCT Filed: May 25, 2021

(86) PCT No.: PCT/JP2021/019709
§ 371 (c)(1),
(2) Date: Jan. 19, 2023

(87) PCT Pub. No.: WO2022/018959
PCT Pub. Date: Jan. 27, 2022

(65) Prior Publication Data
US 2023/0353144 A1 Nov. 2, 2023

(30) Foreign Application Priority Data
Jul. 20, 2020 (JP) .................... 2020-123584

(51) Int. Cl.
*H03K 17/691* (2006.01)
*H02M 3/07* (2006.01)
(Continued)

(52) U.S. Cl.
CPC ............ *H03K 17/691* (2013.01); *H02M 3/07* (2013.01); *H02M 3/33523* (2013.01); *H03K 19/0175* (2013.01)

(58) Field of Classification Search
CPC ............... H03K 17/691; H03K 17/567; H03K 19/0175; H03K 2217/0081; H02M 3/07; H02M 3/33523; H02M 1/0006
See application file for complete search history.

(56) References Cited

U.S. PATENT DOCUMENTS 8,929,106 B2 * 1/2015 Reddy .................... H02M 1/36
363/49
9,673,809 B1 * 6/2017 Kandah ............... H03K 17/691
(Continued)

FOREIGN PATENT DOCUMENTS

DE 4325899 2/1995
DE 102015101525 8/2015
(Continued)

OTHER PUBLICATIONS

International Search Report in International Appln. No. PCT/JP2021/019709, dated Jul. 27, 2021, 5 pages (with English Translation).
(Continued)

*Primary Examiner* — Sibin Chen
(74) *Attorney, Agent, or Firm* — Fish & Richardson P.C.

(57) ABSTRACT

A signal transmission device 100 includes an isolated signal transmission circuit 10 configured to transmit a pulse signal from a primary circuit system 1p via a first isolating element ISO1 to a secondary circuit system 1s, and an isolated power supply control circuit 20 which serves as a controlling agent of an isolation-type power supply that generates a second supply voltage Vcc2 for the secondary circuit system 1s from a first supply voltage Vcc1 for the primary circuit system 1p and which transmits an output feedback signal of the isolation-type power supply from the secondary circuit system 1s via a second isolating element ISO2 to the primary circuit system 1p.

20 Claims, 7 Drawing Sheets

(51) Int. Cl.
  *H02M 3/335* (2006.01)
  *H03K 19/0175* (2006.01)

(56)       References Cited

U.S. PATENT DOCUMENTS

| | | | |
|---|---|---|---|
| 9,887,564 | B2 | 2/2018 | Fahlenkamp et al. |
| 10,135,272 | B2 | 11/2018 | Fahlenkamp et al. |
| 10,193,457 | B1* | 1/2019 | Hande .................... H02M 1/36 |
| 2011/0267848 | A1* | 11/2011 | Satake .................... H01F 27/34 |
| | | | 363/21.12 |
| 2012/0212251 | A1 | 8/2012 | Yanagishima et al. |
| 2012/0327688 | A1* | 12/2012 | Guthrie ................. H02M 3/285 |
| | | | 363/15 |
| 2014/0009975 | A1* | 1/2014 | Morong ............ H02M 3/33507 |
| | | | 363/21.13 |
| 2015/0229149 | A1 | 8/2015 | Fahlenkamp et al. |
| 2018/0115174 | A1 | 4/2018 | Fahlenkamp et al. |
| 2018/0181158 | A1* | 6/2018 | Kanjavalappil Raveendranath .... |
| | | | G05F 5/00 |
| 2020/0083874 | A1* | 3/2020 | Zhuo ........................ H03K 7/08 |

FOREIGN PATENT DOCUMENTS

| | | | |
|---|---|---|---|
| JP | | 2011078188 | * 4/2011 |
| JP | | 2014014244 | 1/2014 |
| JP | | 2018011108 | 1/2018 |
| JP | | 2019191036 | 10/2019 |
| WO | WO 2011055611 | | 5/2011 |
| WO | WO 2016128047 | | 8/2016 |

OTHER PUBLICATIONS

DE OA—German Patent and Trademark Office, Office Action in German Appln. No. 112021002919.3, dated Oct. 22, 2024, 10 pages (with English translation).

* cited by examiner

SIGNAL TRANSMISSION DEVICE, ELECTRONIC APPLIANCE, AND VEHICLE

CROSS REFERENCE TO RELATED APPLICATIONS

This application is a U.S. National Phase application under 35 U.S.C. § 371 of International Patent Application No. PCT/JP2021/019709, filed on May 25, 2021, which claims the priority of Japanese Patent Application No. 2020-123584, filed on Jul. 20, 2020, the disclosure of which is incorporated herein by reference in its entirety.

TECHNICAL FIELD

The invention disclosed herein relates to a signal transmission device, and also relates to an electronic appliance and a vehicle using such a signal transmission device.

BACKGROUND ART

Some known signal transmission devices in practical use are provided with a function of transmitting a pulse signal while isolating between a primary and a secondary circuit system (an isolated signal transmission function).

An example of known technology related to what has just been mentioned is seen in Patent Document 1 identified below.

LIST OF CITATIONS

Patent Literature

Patent Document 1: Japanese Unexamined Patent Application Publication No. 2018-011108

SUMMARY OF THE INVENTION

Problem to be Solved by the Invention

Incidentally, some conventional signal transmission devices have, not only an isolated signal transmission function inherent to them, but also a function of feeding electric power from a primary circuit system to a secondary circuit system (an isolated power control function).

Inconveniently, in conventional signal transmission devices, output feedback control for a flyback power supply is performed based on, for example, an induced voltage that appears in an auxiliary winding of a flyback transformer. This leaves room for further improvement in terms of the output accuracy of the flyback power supply.

In view of the above-mentioned challenge encountered by the present inventors, an object of the present invention is to provide a signal transmission device provided with an accurate isolated power control function and also to provide an electronic appliance and a vehicle using such a signal transmission device.

Means for Solving the Problem

According to one aspect of what is disclosed herein, for example, a signal transmission device includes an isolated signal transmission circuit configured to transmit a pulse signal from a primary circuit system via a first isolating element to a secondary circuit system, and an isolated power supply control circuit which serves as a controlling agent of an isolation-type power supply that generates a second supply voltage for the secondary circuit system from a first supply voltage for the primary circuit system and which transmits an output feedback signal of the isolation-type power supply from the secondary circuit system via a second isolating element to the primary circuit system.

Other features, elements, steps, benefits, and characteristics of the present invention will become clearer with reference to the following detailed description of preferred embodiments of the invention in conjunction with the accompanying drawings.

Advantageous Effects of the Invention

According to the invention disclosed herein, it is possible to provide a signal transmission device provided with an accurate isolated power control function, and to provide an electronic appliance and a vehicle employing such a signal transmission device.

DESCRIPTION OF EMBODIMENTS

<Electronic Appliance>

Figure 1:
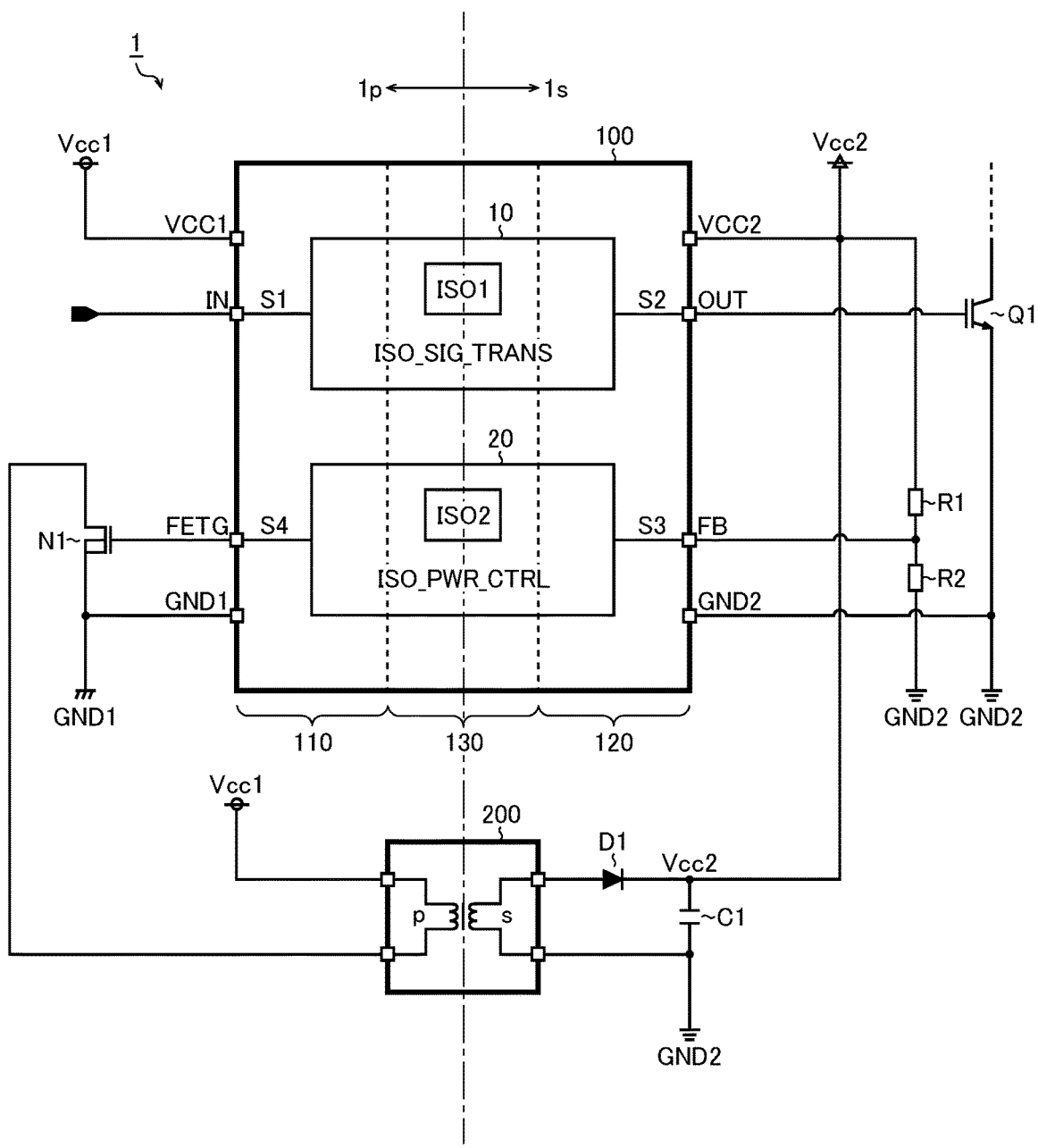
FIG. 1 is a diagram showing one configuration example of an electronic appliance provided with a signal transmission device.

FIG. 1 is a diagram showing one configuration example of an electronic appliance provided with a signal transmission device. The electronic appliance 1 of this configuration example includes a signal transmission device 100 and various discrete components externally connected to it (a flyback transformer 200, an NPN insulated-gate bipolar transistor Q1, an N-channel MOS field-effect transistor N1, a diode D1, a capacitor C1, and resistors R1 and R2).

The signal transmission device 100 is a semiconductor integrated circuit device (what is called an insulated-gate driver IC) which, while electrically isolating between a primary circuit system $1p$ (Vcc1-GND1 system) and a secondary circuit system $1s$ (Vcc2-GND2 system) in the electronic appliance 1, transmits a pulse signal from the primary circuit system $1p$ to the secondary circuit system $1s$ to drive the gate of the transistor Q1 provided in the secondary circuit system $1s$.

As a means for establishing electrical connection with outside the device, the signal transmission device 100 has a plurality of external terminals (as examples of which a VCC1 pin, an IN pin, an FETG pin, a GND1 pin, a VCC2 pin, an OUT pin, an FB pin, and a GND2 pin are shown in the diagram).

In the primary circuit system $1p$ in the electronic appliance 1, the VCC1 pin (primary-side power terminal) is connected to the power line of the primary circuit system $1p$ (that is, an application terminal for a supply voltage Vcc1). The IN pin (a signal input terminal) is connected to an unillustrated signal source. The FETG pin (a gate connection terminal) is connected to the gate of the transistor N1. The GND1 pin (a primary-side ground terminal) and the source of the transistor N1 are both connected to the ground line of the primary circuit system 1p (that is, an application terminal for the ground voltage GND1).

On the other hand, in the secondary circuit system 1s in the electronic appliance 1, the VCC2 pin (secondary-side power terminal) and the first terminal of the resistor R1 are both connected to the power line of the secondary circuit system 1s (that is, an application terminal for a supply voltage Vcc2). The OUT pin (a signal output terminal) is connected to the gate of the transistor Q1. The FB pin (a feedback input terminal) is connected to the second terminal of the resistor R1 and to the first terminal of the resistor R2. The GND2 pin (a secondary-side ground terminal), the emitter of the transistor Q1, and the second terminal of the resistor R2 are all connected to the ground line of the secondary circuit system 1s (that is, an application terminal for the ground voltage GND2).

The flyback transformer 200 along with the transistor N1, the diode D1, and the capacitor C1 forms a flyback power supply (a kind of isolation-type power supply that generates the supply voltage Vcc2 for the secondary circuit system 1s from the supply voltage Vcc1 for the primary circuit system 1p). Here, the flyback transformer 200 includes, a primary winding 200p and a secondary winding 200s which are magnetically coupled together while isolating between the primary circuit system 1p and the secondary circuit system 1s.

The first terminal of the primary winding 200p is connected to the power line of the primary circuit system 1p (that is, the application terminal for the supply voltage Vcc1). The second terminal of the primary winding 200p is connected to the drain of the transistor N1. The first terminal of the secondary winding 200s is connected to the anode of the diode D1. The cathode of the diode D1 and the first terminal of the capacitor C1 are both connected to the power line of the secondary circuit system 1s (that is, the application terminal for the supply voltage Vcc2). The second terminal of the secondary winding 200s and the second terminal of the capacitor C1 are both connected to the ground line of the secondary circuit system 1s (that is, an application terminal for the ground voltage GND2).

The signal transmission device 100 is useful widely in applications in general that require transmitting signals between a primary circuit system 1p and a secondary circuit system 1s while isolating between them (e.g., motor drivers, DC-DC converters, and the like that deal with high voltages).

<Signal Transmission Device>

With reference still to FIG. 1, the internal configuration of the signal transmission device 100 will be described. The signal transmission device 100 of this configuration example includes a controller chip 110 (corresponding to a first chip), a driver chip 120 (corresponding to a second chip), and a transformer chip 130 (corresponding to a third chip).

The controller chip 110 is a semiconductor chip having integrated in it the circuit elements of the primary circuit system 1p that operate by being supplied with the supply voltage Vcc1 (for example, 7 V at the maximum with reference to GND1). The driver chip 120 is a semiconductor chip having integrated in it the circuit elements of the secondary circuit system 1s that operate by being supplied with the supply voltage Vcc2 (for example, 30 V at the maximum with reference to GND2). The transformer chip 130 is a semiconductor chip having integrated in it the transformer for transmitting signals bidirectionally while isolating between controller chip 110 and the driver chip 120.

As described above, the signal transmission device 100 of this configuration example includes, as an independent chip separate from the controller chip 110 and the driver chip 120, the transformer chip 130 incorporating only a transformer, and is produced by sealing these three chips into a single package.

With this configuration, the controller chip 110 and the driver chip 120 can both be formed by a common low- to mid-withstand-voltage process (with a withstand voltage of several volts to several tens of volts), and thus there is no need to use a dedicated high-withstand-voltage process (with a withstand voltage of several kilovolts kV); it is thus possible to reduce manufacturing cost.

The controller chip 110 and the driver chip 120 can both be formed by an existing proven process. Thus, no new reliability test is required, and this contributes to reduced development time and cost.

Even a modification to use a circuit element other than a transformer (for example, a photocoupler) can be easily coped with simply by replacement of the transformer chip 130. It is not necessary to redevelop the controller chip 110 and the driver chip 120, and this contributes to reduced development time and cost.

With attention now paid to main functional blocks, the signal transmission device 100 includes an isolated signal transmission circuit 10 and an isolated power supply control circuit 20.

The isolated signal transmission circuit 10, via an isolating element ISO1 (such as a transformer) integrated in the transformer chip 130, transmits a pulse signal from the primary circuit system 1p to the secondary circuit system 1s while isolating between them. In terms of what is shown in the diagram, the isolated signal transmission circuit 10 transmits an input pulse signal S1 fed in via the IN pin of the primary circuit system 1p as an output pulse signal S2 fed out via the OUT pin of the secondary circuit system 1s.

The isolated power supply control circuit 20 serves as the principal controlling agent of the flyback power supply described previously and, via an isolating element ISO2 (such as a transformer) integrated in the transformer chip 130, transmits an output feedback signal of the flyback power supply from the secondary circuit system 1s to the primary circuit system 1p while isolating between them. In terms of what is shown in the diagram, the isolated power supply control circuit 20, in accordance with an output feedback signal S3 fed in via the FB pin (that is, a division voltage of the supply voltage Vcc2), generates a gate driving signal S4 to be fed out via the FETG pin.

As described above, the signal transmission device 100 incorporates the transformer chip 130 inherently having integrated in it the isolating element ISO1 used for signal transmission from the primary circuit system 1p to the secondary circuit system 1s. Thus, by additionally integrating in the transformer chip 130 the isolating element ISO2 for isolated power control, it is possible, within the signal transmission device 100, to transmit the output feedback signal S3 of the flyback power supply from the secondary circuit system 1s to the primary circuit system 1p.

That is, with the signal transmission device 100 of this configuration example (in particular, the isolated power supply control circuit 20), it is possible to directly detect the supply voltage Vcc2 (corresponding to the output voltage of the flyback power supply) in the secondary circuit system 1s and transmit the detection result to the primary circuit system 1p in the flyback power supply. Thus, unlike the conventional method using an auxiliary winding of the flyback transformer 200, it is possible to enhance the output accuracy of the flyback power supply regardless of load variation.

This eliminates the need to provide an auxiliary winding in the flyback transformer 200; thus it is possible to make the flyback transformer 200 (and hence the electronic appliance 1) compact.

The circuit elements of the isolated signal transmission circuit 10 and the isolated power supply control circuit 20 are integrated together in a form distributed among the controller chip 110, the driver chip 120, and the transformer chip 130 (details will be given later).

<Isolated Signal Transmission Circuit>

Figure 2:
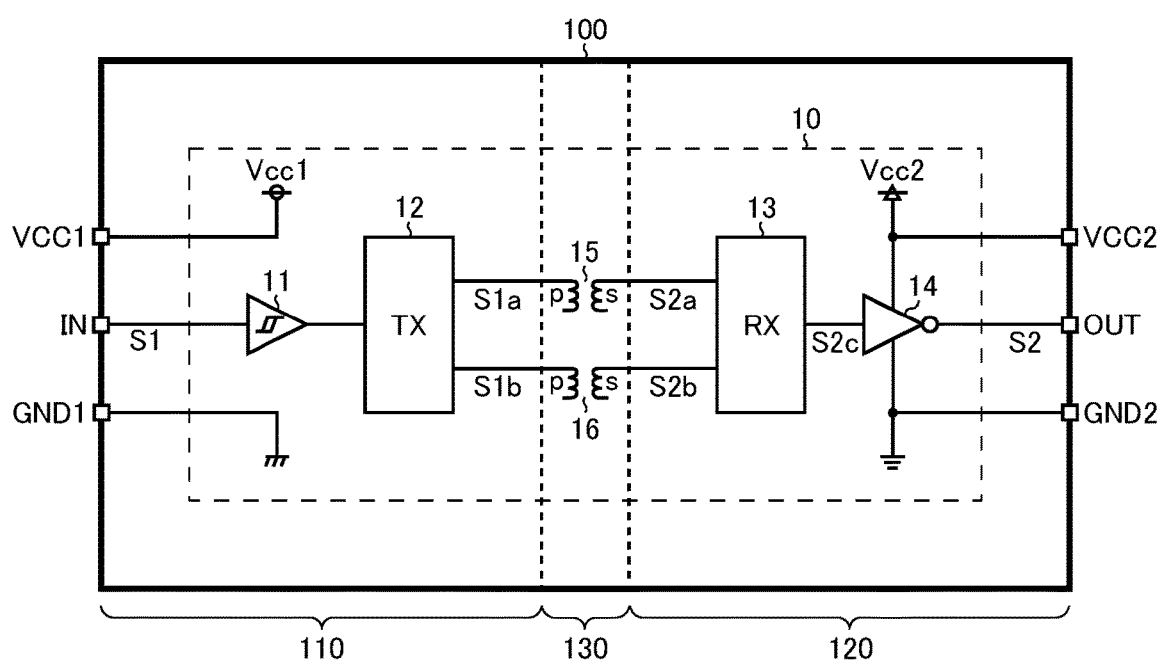
FIG. 2 is a diagram showing one configuration example of an isolated signal transmission circuit.

FIG. 2 is a diagram showing one configuration example of the isolated signal transmission circuit 10. The isolated signal transmission circuit 10 of this configuration example includes a Schmitt buffer 11, a pulse transmitter 12, a pulse receiver 13, a driver 14, and transformers 15 and 16 (corresponding to the isolating element ISO1 described previously).

The Schmitt buffer 11 is one example of a waveform shaping means and is connected between the IN pin and the pulse transmitter 12.

The pulse transmitter 12, in accordance with the logic level of the input pulse signal S1 fed in via the IN pin through the Schmitt buffer 11, pulse-drives one of transmission pulse signals S1a and S1b. For example, the pulse transmitter 12, when notifying that the input pulse signal S1 is at high level, pulse-drives (outputs a single or a plurality of transmission pulses as) the transmission pulse signal S1a fed to the primary winding 15p of the transformer 15 and, when notifying that the input pulse signal S1 is at low level, pulse-drives the transmission pulse signal S1b fed to the primary winding 16p of the transformer 16.

The Schmitt buffer 11 and the pulse transmitter 12 described above are both integrated into the controller chip 110 in the primary circuit system 1p (Vcc1-GND1 system).

The pulse receiver 13, in accordance with the pulse signals S2a and S2b fed from the transformers 15 and 16 respectively, generates a received pulse signal S2c. For example, when, as a result of the transmission pulse signal S1a being pulse-driven, the pulse receiver 13 detects an induced pulse in the received pulse signal S2a that appears in the secondary winding 15s of the transformer 15, the pulse receiver 13 drops the received pulse signal S2c to low level. By contrast, when, as a result of the transmission pulse signal S1b being pulse-driven, the pulse receiver 13 detects an induced pulse in the received pulse signal S2b that appears in the secondary winding 16s of the transformer 16, the pulse receiver 13 raises the received pulse signal S2c to high level.

The driver 14 generates the output pulse signal S2 (corresponding to the gate signal of the transistor Q1) in accordance with the received pulse signal S2c fed from the pulse receiver 13. For example, in a configuration where an inverter is used as the driver 14, when the received pulse signal S2c is at low level, the output pulse signal S2 is at high level, and, when the received pulse signal S2c is at high level, the output pulse signal S2 is at low level. That is, the logic level of the output pulse signal S2 changes in accordance with the logic level of the input pulse signal S1.

The pulse receiver 13 and the driver 14 described above are both integrated into the driver chip 120 in the secondary circuit system 1s (Vcc2-GND2 system).

The transformer 15, in accordance with the transmission pulse signal S1a fed to the primary winding 15p, outputs the received pulse signal S2a from the secondary winding 15s. On the other hand, the transformer 16, in accordance with the transmission pulse signal S1b fed to the primary winding 16p, outputs the received pulse signal S2b from the secondary winding 16s.

The transformers 15 and 16 are both integrated into the transformer chip 130. The transformer chip 130, while isolating between the controller chip 110 and the driver chip 120 with the transformers 15 and 16, outputs the transmission pulse signals S1a and S1b fed from the pulse transmitter 12 to the pulse receiver 13 as the received pulse signals S2a and S2b respectively.

Due to the characteristics of spiral coils used for isolated communication, the input pulse signal S1 is, after being split into the two transmission pulse signals S1a and S1b (corresponding to a rise signal and a fall signal), transmitted from the primary circuit system 1p via the transformers 15 and 16 constituting two channels to the secondary circuit system 1s.

Figure 3:
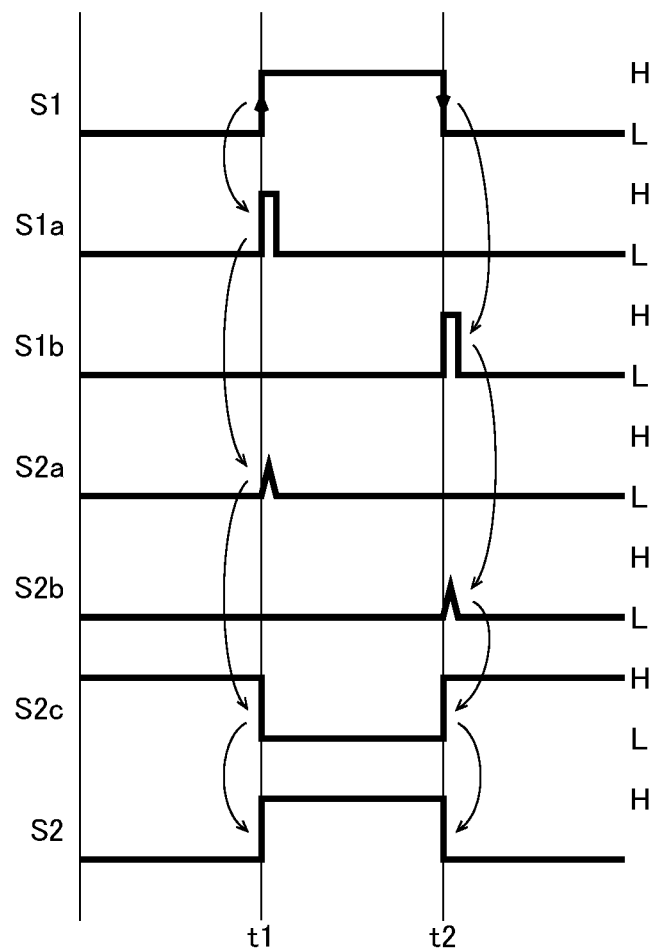
FIG. 3 is a diagram showing one configuration example of isolated signal transmission operation.

FIG. 3 is a diagram showing one example of isolated signal transmission operation by the isolated signal transmission circuit 10, illustrating, from top down, the input pulse signal S1, the transmission pulse signals S1a and S1b, the received pulse signals S2a to S2c, and the output pulse signal S2. In the diagram, for convenience of explanation, signal delays are omitted from illustration.

The pulse transmitter 12 pulse-drives the transmission pulse signal S1a at a rising edge in the input pulse signal S1 at time point t1, and pulse-drives the transmission pulse signal S1b at a falling edge in the input pulse signal S1 at time point t2. The pulse receiver 13 drops the received pulse signal S2c to low level on detecting the induced pulse in the received pulse signal S2a that appears as a result of the transmission pulse signal S1a being pulse-driven, and raises the received pulse signal S2c to high level on detecting the induced pulse in the received pulse signal S2b that appears as a result of the transmission pulse signal S1b being pulse-driven. As a result, when the input pulse signal S1 rises to high level, the output pulse signal S2 together rises to high level and, reversely, when the input pulse signal S1 falls to low level, the output pulse signal S2 together falls to low level.

<Isolated Power Supply Control Circuit>

Figure 4:
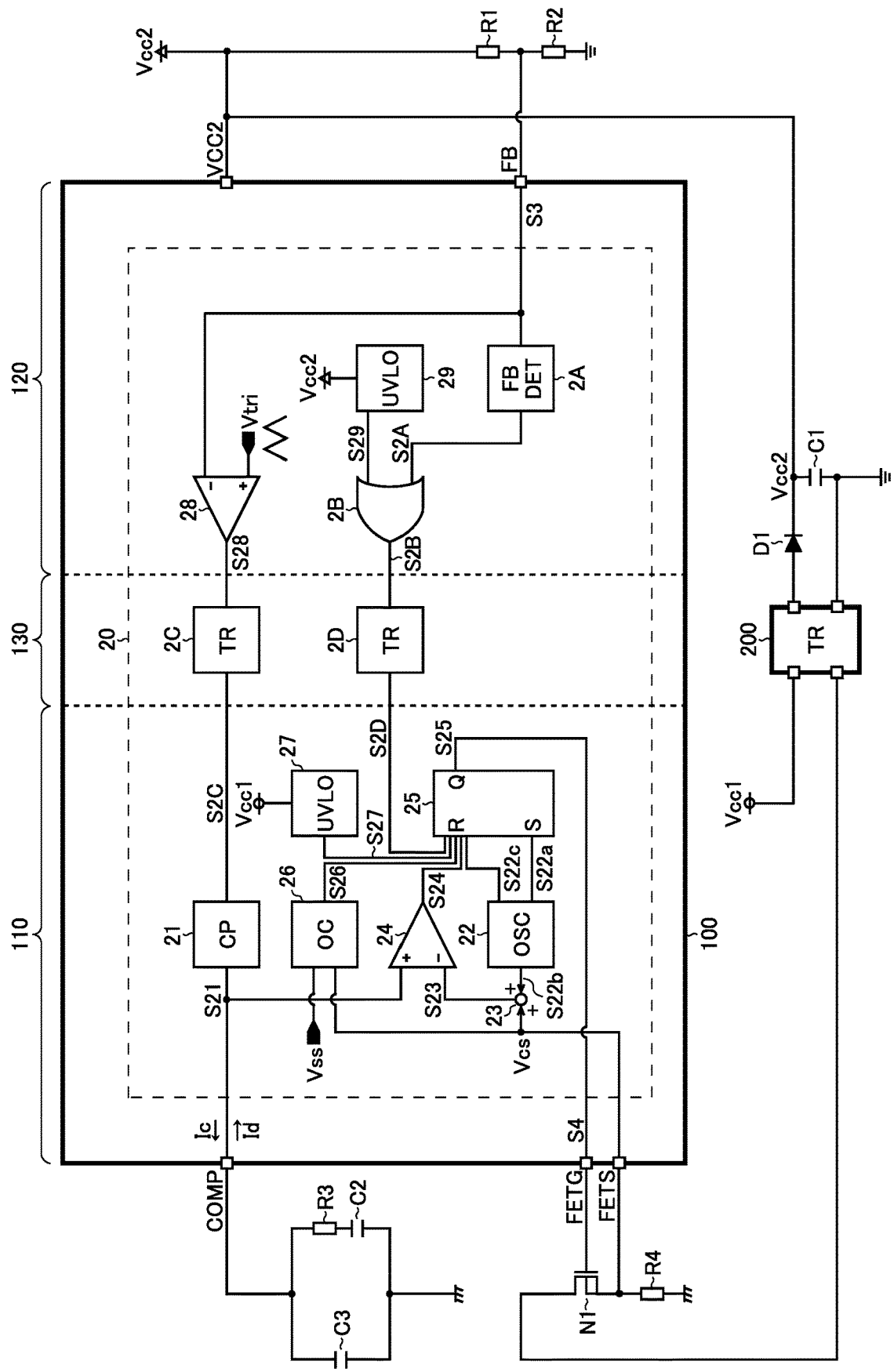
FIG. 4 is a diagram showing one configuration example of an isolated power supply control circuit.

FIG. 4 is a diagram showing one configuration example of the isolated power supply control circuit 20. The isolated power supply control circuit 20 of this configuration example includes a charge pump 21, an oscillator 22, an adder 23, a comparator 24, an RS flip-flop 25, an overcurrent sensor 26, a low input sensor 27, a comparator 28, a low input sensor 29, an output fault sensor 2A, an OR gate 2B, and transformers 2C and 2D.

Of the circuit elements mentioned above, the charge pump 21, the oscillator 22, the adder 23, the comparator 24, the RS flip-flop 25, the overcurrent sensor 26, and the low input sensor 27 are all integrated into the controller chip 110 in the primary circuit system 1p (Vcc1-GND1 system). On the other hand, the comparator 28, the low input sensor 29, the output fault sensor 2A, and the OR gate 2B are all integrated into the driver chip 120 in the secondary circuit system 1s (Vcc2-GND2 system). The transformers 2C and 2D are both integrated into the transformer chip 130.

Further, in the diagram, as an external terminal of the signal transmission device 100, a COMP pin (a phase compensation terminal) and an FETS pin (a current sensing terminal) are shown specifically, and, as discrete components externally connected to these external terminals, the capacitors C2 and C3 and the resistors R3 and R4 are shown specifically. These are interconnected as follows. The COMP pin is connected to the respective first terminals of the resistor R3 and the capacitor C3. The second terminal of the resistor R3 is connected to the first terminal of the capacitor C2. The respective second terminals of the capacitor C2 and C3 are both connected to the ground line of the primary circuit system 1p (that is, the application terminal for the ground voltage GND1). The FETS pin is connected to the source of the transistor N1 and to the first terminal of the resistor R4. The second terminal of the resistor R4 is connected to the ground line of the primary circuit system 1p.

The charge pump 21, by charging and discharging the capacitors C2 and C3 connected to the COMP pin in accordance with an output feedback pulse signal S2C fed from the transformer 2C, generates an analog signal S21. For example, the charge pump 21 generates a charge current Ic when the output feedback pulse signal S2C is at high level and generates a discharge current Id when the output feedback pulse signal S2C is at low level. Here, it is preferable that, by trimming or the like, the charge current Ic and the discharge current Id be adjusted such that their current ratio is 1:1.

The oscillator 22 generates, at a predetermined switching frequency (for example, 100 kHz), a set signal S22a with a rectangular waveform and a slope signal S22b with a sawtooth-shaped waveform. The oscillator 22 also has a function of generating a pulse in a maximum duty signal S22c when a predetermined time has passed after generating a pulse in the set signal S22a.

The adder 23 adds up the slope signal S22b fed from the oscillator 22 and a current sense signal Vcs fed in via the FETS pin to generate an added slope signal S23 (=S22b+Vcs).

The comparator 24 generates a reset signal S24 by comparing the analog signal S21, which is fed to the inverting input terminal (+) of the comparator 24, with the added slope signal S23, which is fed to the inverting input terminal (−) of the comparator 24. The reset signal S24 is at high level when S21>S23 and is at low level when S21<S23. Here, the comparator 24 may be fed with the slope signal S22b instead of the added slope signal S23.

The RS flip-flop 25 basically switches the logic level of its output signal S25, which is output from its output terminal (Q), in accordance with the set signal S22a, which is fed to the set terminal (S) of the RS flip-flop 25, and the reset signal S24, which is fed to the reset terminal (R) of the RS flip-flop 25. For example, the RS flip-flop 25 sets the output signal S25 to high level when the set signal S22a rises to high level and resets the output signal S25 to low level when the reset signal S24 rises to high level. The output signal S25 is fed out via the FETG pin as the gate driving signal S4 for the transistor N1 (corresponding to the output transistor of the flyback power supply). The transistor N1 is on when the gate driving signal S4 is at high level, and is off when the gate driving signal S4 is at low level.

The reset terminal (R) of the RS flip-flop 25 is fed with, in addition to the reset signal S24 mentioned above, an overcurrent sense signal S26, a low input sense signal S27, and a secondary-side fault sense signal S2D, and, when any of the sense signal rises to high level, the output signal S25 (and hence the gate driving signal S4) is reset to low level. That is, the isolated power supply control circuit 20 of this configuration example has a function of forcibly suspending the flyback power supply when a fault is detected in the signal transmission device 100.

Furthermore, the reset terminal (R) of the RS flip-flop 25 is fed with the maximum duty signal S22c so that, also when the maximum duty signal S22c rises to high level, the output signal S25 (and hence the gate driving signal S4) is reset to low level. That is, the isolated power supply control circuit 20 of this configuration example also has a function of setting an upper limit to the output duty of the flyback power supply.

The overcurrent sensor 26 monitors the current sense signal Vcs fed in via the FETS pin to generate the overcurrent sense signal S26. The overcurrent sense signal S26 is at high level (a logic level indicating an overcurrent being detected) when the current sense signal Vcs is higher than a predetermined overcurrent sensing threshold value. The overcurrent sensor 26 is fed with a soft start voltage Vss that rises gently during the start-up of the signal transmission device 100. When the soft start voltage Vss is lower than the overcurrent sensing threshold value mentioned above, the current sense signal Vcs is compared with the soft start voltage Vss. As a result, during the start-up of the signal transmission device 100, the primary-side current through the transistor N1 is gently raised.

The low input sensor 27 monitors the supply voltage Vcc1 of the primary circuit system 1p to generate the low input sense signal S27. Here, the low input sense signal S27 is at high level when the supply voltage Vcc1 is lower than a UVLO (under voltage lock out) unlocking voltage.

The comparator 28 generates an output feedback pulse signal S28 by comparing a triangular-wave voltage Vtri, which is fed to the non-inverting input terminal (+) of the comparator 28, with an output feedback signal S3 (corresponding to a division voltage of the supply voltage Vcc2), which is fed in the inverting input terminal (−) of comparator 28 via the FB pin. Here, the oscillation frequency of the triangular-wave voltage Vtri may be set to an appropriate value (for example, 200 KHz) in accordance with the frequency characteristics of the transformer 2C connected in a stage succeeding the comparator 28.

The low input sensor 29 monitors the supply voltage Vcc2 of the secondary circuit system 1s to generate a low input sense signal S29. Here, the low input sense signal S29 is at high level when the supply voltage Vcc2 is lower than the UVLO unlocking voltage.

The output fault sensor 2A monitors the output feedback signal S3 to generate an output fault sense signal S2A. The output fault sense signal S2A is at high level when there is a fault in the output feedback signal S3 (as when the output of the flyback power supply is open or short-circuited).

The OR gate 2B generates a secondary-side fault sense signal S2B by performing a logical OR operation between the low input sense signal S29 and the output fault sense signal S2A. The secondary-side fault sense signal S2B is at high level when at least one of the low input sense signal S29 and the output fault sense signal S2A is at high level, and is at low level when both the low input sense signal S29 and the output fault sense signal S2A are at low level.

The transformer 2C, while isolating between the controller chip 110 and the driver chip 120, outputs the output feedback pulse signal S28 for the secondary circuit system 1s fed from the comparator 28 to the charge pump 21 as the output feedback pulse signal S2C for the primary circuit system 1p. Although, in the diagram, for the sake of convenient illustration, the transformer 2C is shown to receive a signal directly from the comparator 28, in practice, an unillustrated transmission pulse generator (a circuit portion similar to the pulse transmitter 12 described previously) is provided in the stage preceding the transformer 2C, and a rising edge and a falling edge in the output feedback pulse signal S28 are transmitted using a pair of transformers.

The transformer 2D, while isolating between the controller chip 110 and the driver chip 120, outputs the secondary-side fault sense signal S2B for the secondary circuit system 1s fed from the OR gate 2B to the reset terminal (R) of the RS flip-flop 25 as the secondary-side fault sense signal S2D for the primary circuit system 1p. Although, in the diagram, for the sake of convenient illustration, the transformer 2D is shown to receive a signal directly from the OR gate 2B, in practice, an unillustrated transmission pulse generator (a circuit portion similar to the pulse transmitter 12 mentioned above) is provided in the stage preceding the transformer 2D, and a rising edge and a falling edge in the secondary-side fault sense signal S2B are transmitted using a pair of transformers.

Figure 5:
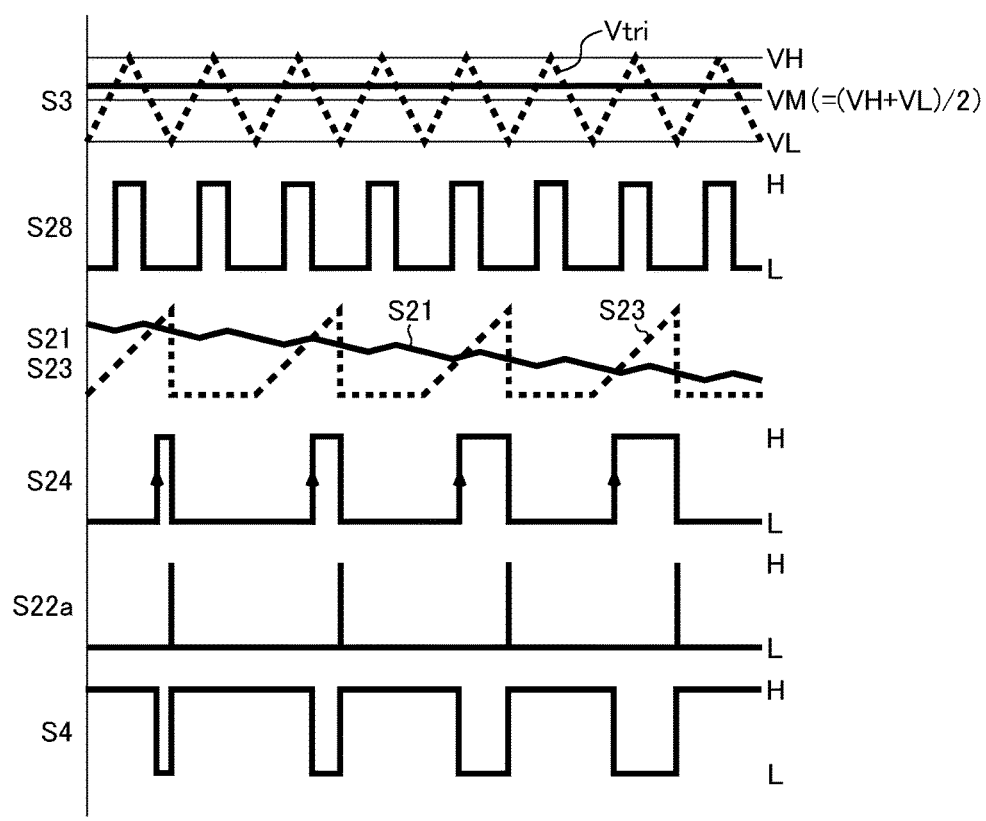
FIG. 5 is a diagram showing a first example of output feedback control.

FIG. 5 is a diagram showing a first example of output feedback control (with S3>VM) by the isolated power supply control circuit 20, illustrating, from top down, the output feedback signal S3 (solid line) and the triangular-wave voltage Vtri (broken line), the output feedback pulse signal S28, the analog signal S21 (solid line) and the added slope signal S23 (broken line), the reset signal S24, the set signal S22a, and the gate driving signal S4.

In the secondary side of the isolated power supply control circuit 20, the output feedback signal S3 externally fed in via the FB pin is compared with the triangular-wave voltage Vtri generated within the signal transmission device 100, and thereby the output feedback pulse signal S28 is generated. The higher the output feedback signal S3 (and hence the supply voltage Vcc2), the lower the duty ratio of the output feedback pulse signal S28, and the lower the output feedback signal S3, the higher the duty ratio of the output feedback pulse signal S28.

In the diagram, the output feedback signal S3 is higher than the middle value VM (=(VH+VL)/2) of the triangular-wave voltage Vtri that varies periodically between the peak value VH (for example, 2V) and the bottom value VL (for example, 1V); thus, the duty ratio of the output feedback pulse signal S28 is lower than 50%. This state corresponds to a state in which the supply voltage Vcc2 is higher than the target value.

The output feedback pulse signal S28 is transmitted from the secondary circuit system 1s to the primary circuit system 1p via the transformer 2C. That is, the isolated power supply control circuit 20 converts the output feedback signal S3 commensurate with the supply voltage Vcc2 into the output feedback pulse signal S28 and transmits this to the primary circuit system 1p.

On the other hand, in the primary side of the isolated power supply control circuit 20, the analog signal S21 is generated in accordance with the duty ratio of the output feedback pulse signal S28 (more precisely, the output feedback pulse signal S2C transmitted via the transformer 2C). In the diagram, the duty ratio of the output feedback pulse signal S28 is lower than 50%, and thus the analog signal S21 tends to decrease.

Furthermore, the analog signal S21 is compared with the added slope signal S23, and thereby the reset signal S24 is generated. Here, the lower the analog signal S21, the earlier the timing at which the analog signal S21 intersects with the added slope signal S23 (that is, the timing at which a pulse is generated in the reset signal S24).

Then, based on the set signal S22a and the reset signal S24, the gate driving signal S4 for the transistor N1 is generated. As described previously, the gate driving signal S4 is set to high level when the set signal S22a rises to high level and is reset to low level when the reset signal S24 rises to high level. Thus, the earlier the timing at which the pulse is generated in the reset signal S24, the sooner the transistor N1 is turned off.

In this way, when the supply voltage Vcc2 is higher than the target value, the supply voltage Vcc2 is lowered by reducing the output duty of the flyback power supply, and thereby output feedback is applied such that the supply voltage Vcc2 equals the target value.

Figure 6:
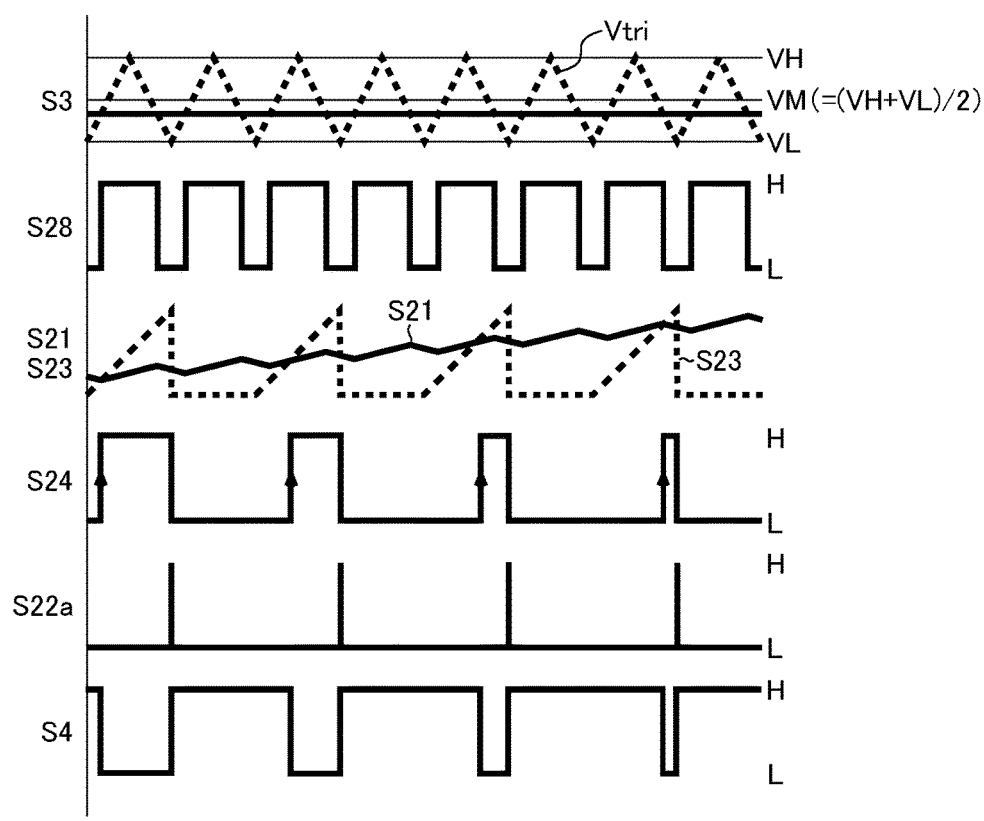
FIG. 6 is a diagram showing a second example of output feedback control.

FIG. 6 is a diagram showing a second example of output feedback control (with S3<VM) by the isolated power supply control circuit 20, illustrating, like FIG. 5 referred to previously, from top down, the output feedback signal S3 (solid line) and the triangular-wave voltage Vtri (broken line), the output feedback pulse signal S28, the analog signal S21 (solid line) and the added slope signal S23 (broken line), the reset signal S24, the set signal S22a, and the gate driving signal S4.

Although basic operation of output feedback control is similar to that in FIG. 5 referred to previously, in FIG. 6, the output feedback signal S3 is lower than the middle value VM of the triangular-wave voltage Vtri, and thus the duty ratio of the output feedback pulse signal S28 is higher than 50%. This state corresponds to a state in which the supply voltage Vcc2 is lower than the target value.

In this case, the analog signal S21 generated in the primary-side of the isolated power supply control circuit 20 tends to increase. Here, the higher the analog signal S21, the later the timing at which the analog signal S21 intersects with the added slope signal S23 (that is, the timing at which a pulse is generated in the reset signal S24); thus, the transistor N1 is kept on longer.

In this way, when the supply voltage Vcc2 is lower than the target value, the supply voltage Vcc2 is lowered by increasing the output duty of the flyback power supply, and thereby output feedback is applied such that the supply voltage Vcc2 equals the target value.

When the output feedback signal S3 equals the middle value of the triangular-wave voltage Vtri and the duty ratio of the output feedback pulse signal S28 is kept around 50%, the periods for which the charge pump 21 generates the charge current Ic and the discharge current Id respectively are equal, and thus the analog signal S21 remains stable. This state corresponds to a state in which the supply voltage Vcc2 is adjusted to the target value.

<Application to Vehicles>

Figure 7:
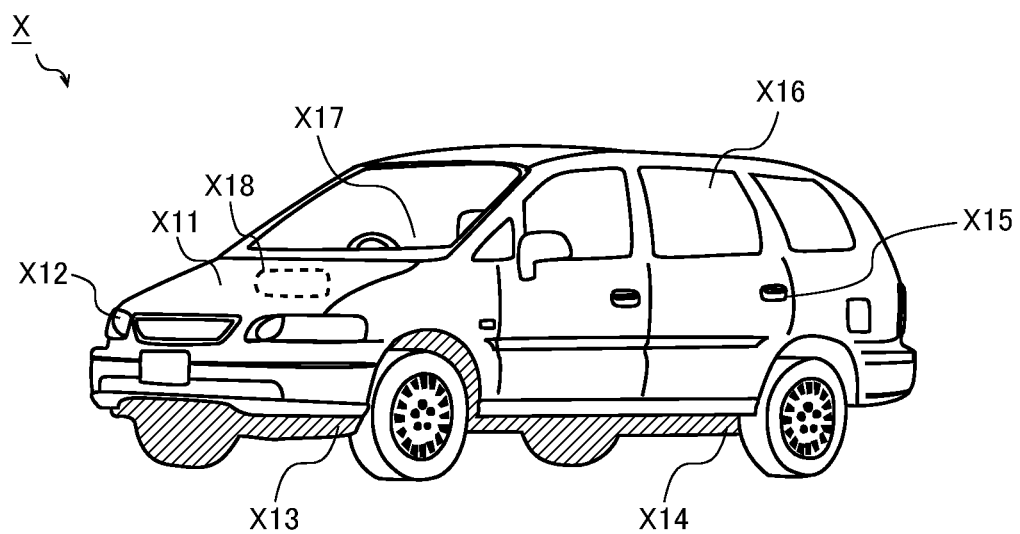
FIG. 7 is an exterior view of a vehicle.

FIG. 7 is a diagram showing an external appearance of a vehicle incorporating electronic appliances. The vehicle X of this configuration example incorporates various electronic appliances X11 to X18 that operate by being supplied with electric power from an unillustrated battery. It should be noted that, for the sake of convenient illustration, FIG. 7 may show the electronic appliances X11 to X18 elsewhere than they are actually arranged.

The vehicle X may be an engine vehicle, or may be an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

The electronic appliance X11 is an electronic control unit which performs control with respect to an engine (injection control, electronic throttle control, idling control, oxygen sensor heater control, automatic cruise control, etc.) or a motor (torque control, power regeneration control, etc.).

The electronic appliance X12 is a lamp control unit that controls the lighting and extinguishing of HIDs (high-intensity discharge lamps), DRLs (daytime running lamps), and the like.

The electronic appliance X13 is a transmission control unit which performs control with respect to a transmission.

The electronic appliance X14 is a behavior control unit which performs control with respect to the movement of the vehicle X (ABS [anti-lock brake system] control, EPS [electric power steering] control, electronic suspension control, etc.).

The electronic appliance X15 is a security control unit which drives and controls door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, such as A/V (audio/visual) equipment, a car navigation system, and an ETC (electronic toll collection system).

The electronic appliance X18 comprises electronic appliances provided with high-withstand-voltage motors, such as a vehicle-mounted blower, an oil pump, a water pump, and a battery cooling fan.

The electronic appliances X11 to X18 can be understood as practical examples of the electronic appliance 1 described previously. That is, the signal transmission device 100 described previously can be incorporated into any of the electronic appliances X11 to X18.

<Overview>

To follow is an overview of the various embodiments described thus far.

According to one aspect of what is disclosed herein, for example, a signal transmission device includes an isolated signal transmission circuit configured to transmit a pulse signal from a primary circuit system via a first isolating element to a secondary circuit system, and an isolated power supply control circuit which serves as a controlling agent of an isolation-type power supply that generates a second supply voltage for the secondary circuit system from a first supply voltage for the primary circuit system and which transmits an output feedback signal of the isolation-type power supply from the secondary circuit system via a second isolating element to the primary circuit system (a first configuration).

In the signal transmission device according to the first configuration described above, preferably, the isolated power supply control circuit is configured to convert the output feedback signal commensurate with the second supply voltage into an output feedback pulse signal and transmit this to the primary circuit system (a second configuration).

In the signal transmission device according to the second configuration described above, preferably, the isolated power supply control circuit includes a comparator configured to generate the output feedback pulse signal by comparing the output feedback signal with a triangular-wave voltage in the secondary circuit system (a third configuration).

In the signal transmission device according to the second or third configuration described above, preferably, the isolated power supply control circuit generates an analog signal commensurate with the duty ratio of the output feedback pulse signal in the primary circuit system, and controls the output duty of the isolation-type power supply by comparing the analog signal with a slope signal (a fourth configuration).

In the signal transmission device according to the fourth configuration described above, preferably, the isolated power supply control circuit includes a charge pump configured to generate the analog signal by charging and discharging a capacitor in accordance with the output feedback pulse signal in the primary circuit system (a fifth configuration).

In the signal transmission device according to any of the first to fifth configurations described above, preferably, the isolated power supply control circuit forcibly suspends the isolation-type power supply when a fault is detected in the signal transmission device (for example, when a fault is detected in any of the first supply voltage, the second supply voltage, and the output feedback signal) (a sixth configuration).

The signal transmission device according to any of the first to sixth configurations described above, preferably, further includes, sealed in a single package, a first chip having circuit elements of the primary circuit system integrated in it, a second chip having circuit elements of the secondary circuit system integrated in it, and a third chip having the first and second isolating elements integrated in it (a seventh configuration).

In the signal transmission device according to any of the first to seventh configurations described above, preferably, the isolated signal transmission circuit includes: first and second transformers that correspond to the first isolating element; a pulse transmitter configured to pulse-drive a first transmission pulse signal fed to a primary winding of the first transformer when notifying that an input pulse signal is at a first logic level, and to pulse-drive a second transmission pulse signal fed to a primary winding of the second transformer when notifying that the input pulse signal is at a second logic level; a pulse receiver configured to switch a received pulse signal to a first logic level when, as a result of the first transmission pulse signal being pulse-driven, the pulse receiver detects an induced pulse in a first received pulse signal that appears in a secondary winding of the first transformer, and to switch the received pulse signal to a second logic level when, as a result of the second transmission pulse signal being pulse-driven, the pulse receiver detects an induced pulse in a second received pulse signal that appears in a secondary winding of the second transformer; and a driver configured to generate an output pulse signal in accordance with the received pulse signal (an eighth configuration).

According to another aspect of what is disclosed herein, an electronic appliance includes the signal transmission device according to any of the first to eighth configurations described above (a ninth configuration).

According to yet another aspect of what is disclosed herein, a vehicle includes the electronic appliance according to the ninth configuration described above (a tenth configuration).

<Further Modifications>

The various technical features disclosed herein may be implemented in any other manners than in the embodiments described above, and allow for any modifications made without departure from their technical ingenuity. That is, the above embodiments should be understood to be in every aspect illustrative and not restrictive. The scope of the present invention is defined not by the description of the embodiments given above but by the appended claims, and should be understood to encompass any modifications made in a sense and scope equivalent to those of the claims.

LIST OF REFERENCE SIGNS 1 electronic appliance
1p primary circuit system
1s secondary circuit system
10 isolated signal transmission circuit
11 Schmitt buffer
12 pulse transmitter
13 pulse receiver
14 driver
15, 16 transformer
15p, 16p primary winding
15s, 16s secondary winding
20 isolated power supply control circuit
21 charge pump
22 oscillator
23 adder
24 comparator
25 RS flip-flop
26 overcurrent sensor
27 low input sensor
28 comparator
29 low input sensor
2A output fault sensor
2B OR gate
2C, 2D transformer
100 signal transmission device (insulated-gate driver IC)
110 controller chip
120 driver chip
130 transformer chip
200 flyback transformer
200p primary winding
200s secondary winding
C1, C2, C3 capacitor
D1 diode
N1 N-channel MOS field-effect transistor
Q1 NPN insulated-gate bipolar transistor
R1, R2, R3, R4 resistor
TR1, TR2 transformer
X vehicle
X11 to X18 electronic appliances

The invention claimed is:

1. A signal transmission device comprising:
an isolated signal transmission circuit configured to transmit a pulse signal from a primary circuit system via a first isolating element to a secondary circuit system; and
an isolated power supply control circuit to serve as a controlling agent of an isolation-type power supply that generates a second supply voltage for the secondary circuit system from a first supply voltage for the primary circuit system, the isolated power supply control circuit being configured to transmit an output feedback signal of the isolation-type power supply from the secondary circuit system via a second isolating element to the primary circuit system,
wherein the isolated signal transmission circuit includes:
first and second transformers that correspond to the first isolating element;
a pulse transmitter configured to
pulse-drive a first transmission pulse signal fed to a primary winding of the first transformer when notifying that an input pulse signal is at a first logic level, and
pulse-drive a second transmission pulse signal fed to a primary winding of the second transformer when notifying that the input pulse signal is at a second logic level;
a pulse receiver configured to
switch a received pulse signal to a first logic level when, as a result of the first transmission pulse signal being pulse-driven, the pulse receiver detects an induced pulse in a first received pulse signal that appears in a secondary winding of the first transformer, and
switch the received pulse signal to a second logic level when, as a result of the second transmission pulse signal being pulse-driven, the pulse receiver detects an induced pulse in a second received pulse signal that appears in a secondary winding of the second transformer; and
a driver configured to generate an output pulse signal in accordance with the received pulse signal.

2. The signal transmission device according to claim 1, wherein the isolated power supply control circuit is configured to convert the output feedback signal commensurate with the second supply voltage into an output feedback pulse signal and transmit the output feedback pulse signal to the primary circuit system.

3. The signal transmission device according to claim 2, wherein the isolated power supply control circuit includes a comparator configured to generate the output feedback pulse signal by comparing the output feedback signal with a triangular-wave voltage in the secondary circuit system.

4. The signal transmission device according to claim 2, wherein the isolated power supply control circuit generates an analog signal commensurate with a duty ratio of the output feedback pulse signal in the primary circuit system, the isolated power supply control circuit controlling an output duty of the isolation-type power supply by comparing the analog signal with a slope signal.

5. The signal transmission device according to claim 4, wherein the isolated power supply control circuit includes a charge pump configured to generate the analog signal by charging and discharging a capacitor in accordance with the output feedback pulse signal in the primary circuit system.

6. The signal transmission device according to claim 1, wherein the isolated power supply control circuit forcibly suspends the isolation-type power supply when a fault is detected in the signal transmission device.

7. The signal transmission device according to claim 1, further comprising, sealed in a single package:
a first chip having circuit elements of the primary circuit system integrated therein;
a second chip having circuit elements of the secondary circuit system integrated therein; and
a third chip having the first and second isolating elements integrated therein.

8. An electronic appliance comprising the signal transmission device according to claim 1.

9. A vehicle comprising the electronic appliance according to claim 8.

10. A signal transmission device comprising:
an isolated signal transmission circuit configured to transmit a pulse signal from a primary circuit system via a first isolating element to a secondary circuit system so as to perform on/off driving a first transistor according to the pulse signal, the transistor connected externally to the signal transmission device;
an isolated power supply control circuit to serve as a controlling agent of an isolation-type power supply that generates a second supply voltage for the secondary circuit system from a first supply voltage for the primary circuit system, the isolated power supply control circuit being configured to transmit an output feedback signal of the isolation-type power supply from the secondary circuit system via a second isolating element to the primary circuit system;

a first terminal configured to receive the second supply voltage; and a second terminal configured to receive the output feedback signal.

11. The signal transmission device according to claim 10, further comprising, a third terminal configured to be connected a control electrode of a second transistor which is connected to a third isolating element.

12. The signal transmission device according to claim 10, wherein the isolated power supply control circuit is configured to convert the output feedback signal commensurate with the second supply voltage into an output feedback pulse signal and transmit the output feedback pulse signal to the primary circuit system.

13. The signal transmission device according to claim 12, wherein the isolated power supply control circuit includes a comparator configured to generate the output feedback pulse signal by comparing the output feedback signal with a triangular-wave voltage in the secondary circuit system.

14. The signal transmission device according to claim 12, wherein the isolated power supply control circuit generates an analog signal commensurate with a duty ratio of the output feedback pulse signal in the primary circuit system, the isolated power supply control circuit controlling an output duty of the isolation-type power supply by comparing the analog signal with a slope signal.

15. The signal transmission device according to claim 14, wherein the isolated power supply control circuit includes a charge pump configured to generate the analog signal by charging and discharging a capacitor in accordance with the output feedback pulse signal in the primary circuit system.

16. The signal transmission device according to claim 10, wherein the isolated power supply control circuit forcibly suspends the isolation-type power supply when a fault is detected in the signal transmission device.

17. The signal transmission device according to claim 10, further comprising, sealed in a single package:

a first chip having circuit elements of the primary circuit system integrated therein;

a second chip having circuit elements of the secondary circuit system integrated therein; and a third chip having the first and second isolating elements integrated therein.

18. An electronic appliance comprising the signal transmission device according to claim 10.

19. A vehicle comprising the electronic appliance according to claim 18.

20. A signal transmission device comprising:

an isolated signal transmission circuit configured to transmit a pulse signal from a primary circuit system via a first isolating element to a secondary circuit system; and an isolated power supply control circuit to serve as a controlling agent of an isolation-type power supply that generates a second supply voltage for the secondary circuit system from a first supply voltage for the primary circuit system, the isolated power supply control circuit being configured to transmit an output feedback signal of the isolation-type power supply from the secondary circuit system via a second isolating element to the primary circuit system, wherein the isolated power supply control circuit is configured to convert the output feedback signal commensurate with the second supply voltage into an output feedback pulse signal and transmit the output feedback pulse signal to the primary circuit system, and the isolated power supply control circuit generates an analog signal commensurate with a duty ratio of the output feedback pulse signal in the primary circuit system, the isolated power supply control circuit controlling an output duty of the isolation-type power supply by comparing the analog signal with a slope signal.

* * * * *